(12) United States Patent
Gao et al.

(10) Patent No.: US 12,340,443 B2
(45) Date of Patent: Jun. 24, 2025

(54) METHOD AND APPARATUS FOR ACCELERATED ACQUISITION AND ARTIFACT REDUCTION OF UNDERSAMPLED MRI USING A K-SPACE TRANSFORMER NETWORK

(71) Applicants: Siemens Healthineers AG, Forchheim (DE); The Regents of the University of California, Oakland, CA (US)

(72) Inventors: Chang Gao, Los Angeles, CA (US); John Paul Finn, Los Angeles, CA (US); Xiaodong Zhong, Oak Park, CA (US)

(73) Assignees: Siemens Healthineers AG, Forchheim (DE); The Regents of the University of California, Oakland, CA (US)

( * ) Notice: Subject to any disclaimer, the term of this patent is extended or adjusted under 35 U.S.C. 154(b) by 390 days.

(21) Appl. No.: 17/934,618

(22) Filed: Sep. 23, 2022

(65) Prior Publication Data

US 2023/0342993 A1    Oct. 26, 2023

Related U.S. Application Data

(60) Provisional application No. 63/363,320, filed on Apr. 21, 2022.

(51) Int. Cl.
  *G06T 11/00*    (2006.01)
  *G01R 33/48*    (2006.01)
(52) U.S. Cl.
  CPC ........ *G06T 11/005* (2013.01); *G01R 33/4818* (2013.01); *G06T 11/006* (2013.01); *G01R 33/4824* (2013.01)

(58) Field of Classification Search
  CPC ........ G06T 11/005; G06T 11/06; G06T 1/00; G06T 2207/10088; G06T 2207/20081; G06T 2207/20084; G06T 2201/00; G06T 2211/00; G06T 5/00; G06T 5/60; G06T 7/00; G06N 3/045; G06N 3/08; G06N 3/09; G06N 3/4046; G06V 10/82; G06V 10/70;
  (Continued)

(56) References Cited

U.S. PATENT DOCUMENTS

2020/0341103 A1\*  10/2020  Akcakaya ............. G06N 3/048
2021/0166446 A1\*  6/2021  Chen ..................... G06N 3/044
(Continued)

OTHER PUBLICATIONS

Wang Z, She H, Du Y. P., Learning-based k-Space Weighted Image Contrast (L-KWIC) for Golden Angle Radial Dynamic MRI, Mar. 14, 2022, In Proceedings of the 2021 8th International Conference on Biomedical and Bioinformatics Engineering (ICBBE '21), Association for Computing Machinery, NY, NY, pp. 20-25 (Year: 2022).\*
(Continued)

*Primary Examiner* — Andrew W Bee
*Assistant Examiner* — Emma E Dryden

(57)    ABSTRACT

A system and methods for recreating images from undersampled magnetic resonance imaging (MRI) image data to remove artifacts from the undersampling. Using trained transformer networks, undersampled k-space data can be acquired and the networks can predict additional projected radial MRI k-space data from the undersampled radial MRI k-space data. Images with fewer artifacts can then be generated.

15 Claims, 12 Drawing Sheets

(58) Field of Classification Search
CPC ............ G01R 33/4818; G01R 33/4826; G01R 33/4824; G01R 33/5608
See application file for complete search history.

(56) References Cited

U.S. PATENT DOCUMENTS

| | | | |
|---|---|---|---|
| 2023/0221388 A1* | 7/2023 | Meng | G01R 33/543 324/309 |
| 2024/0290011 A1* | 8/2024 | Zhou | G06F 17/14 |

OTHER PUBLICATIONS

Mansour R, Thibodeau Antonacci A, Bilodeau L, et al., Impact of temporal resolution and motion correction for dynamic contrast-enhanced MRI of the liver using an accelerated golden-angle radial sequence, Apr. 17, 2020, Physics in Medicine and Biology, vol. 65, No. 8 (Year: 2020).*

Vaswani A, Shazeer N, Parmar N, et al., Attention Is All You Need, 2017, In Advances in Neural Information Processing Systems 30 (NIPS 2017) (Year: 2017).*

Wikipedia.com. BERT (language model) [online], Apr. 17, 2022. Retrieved from the Internet: <https://web.archive.org/web/20220417214109/https://en.wikipedia.org/wiki/BERT_(language_model)> (Year: 2022).*

Chaudhry P, Bidirectional Encoder Representations from Transformers for Modelling Stock Prices, Feb. 2022, International Journal for Research in Applied Science & Engineering Technology, vol. 10, No. 2 (Year: 2022).*

El-Rewaidy, H., Fahmy, A. S., Pashakhanloo, F., et al. Multi-domain convolutional neural network (MD-CNN) for radial reconstruction of dynamic cardiac MRI, 2021, Magnetic resonance in medicine, 85(3), 1195-1208. https://doi.org/10.1002/mrm.28485 (Year: 2021).*

Hyun, Chang Min, et al. "Deep learning for undersampled MRI reconstruction." Physics in Medicine & Biology 63.13 (2018): 135007.

Yang, Guang, et al. "DAGAN: deep de-aliasing generative adversarial networks for fast compressed sensing MRI reconstruction." IEEE transactions on medical imaging 37.6 (2017): 1310-1321.

Malavé, Mario O., et al. "Reconstruction of undersampled 3D non-Cartesian image-based navigators for coronary MRA using an unrolled deep learning model." Magnetic resonance in medicine 84.2 (2020): 800-812.

Kofler, Andreas, et al. "An end-to-end-trainable iterative network architecture for accelerated radial multi-coil 2D cine MR image reconstruction." Medical Physics 48.5 (2021): 2412-2425.

Vaswani, Ashish, et al. "Attention is all you need." Advances in neural information processing systems 30 (2017).

Kingma, Diederik P., and Jimmy Ba. "Adam: A method for stochastic optimization." arXiv preprint arXiv:1412.6980 (2014).

Uecker, Martin, et al. "The BART toolbox for computational magnetic resonance imaging." Proc Intl Soc Magn Reson Med. vol. 24. 2016.

Walsh, David O., Arthur F. Gmitro, and Michael W. Marcellin. "Adaptive reconstruction of phased array MR imagery." Magnetic Resonance in Medicine: An Official Journal of the International Society for Magnetic Resonance in Medicine 43.5 (2000): 682-690.

Lustig,et al., "Compressed Sensing MRI", IEEE Signal Processing Magazine (72), Mar. 2008, pp. 72-82.

Feng, et al. "Golden-Angle Radial Sparse Parallel MRI: Combination of Compressed Sensing, Parallel Imaging, and Golden-Angle Radial Sampling for Fast and Flexible Dynamic Volumetric MRI" Magnetic Resonance in Medicine, vol. 72, No. 3, pp. 707-717, Sep. 2014.

Feng,et al, XD-GRASP: Golden-Angle Radial MRI with Reconstruction of Extra Motion-State Dimensions Using Compressed Sensing, Magn Reson Med. Feb. 2016; 75(2): 775-788.

Yu, et al. "Deep de-aliasing for fast compressive sensing MRI." arXiv preprint arXiv:1705.07137 (2017).

Quan, Tran Minh, Thanh Nguyen-Duc, and Won-Ki Jeong. "Compressed sensing MRI reconstruction using a generative adversarial network with a cyclic loss." IEEE transactions on medical imaging 37.6 (2018): 1488-1497.

Hauptmann, Andreas, et al. "Real-time cardiovascular MR with spatio-temporal artifact suppression using deep learning-proof of concept in congenital heart disease." Magnetic resonance in medicine 81.2 (2019): 1143-1156.

Kofler, Andreas, et al. "Spatio-temporal deep learning-based undersampling artefact reduction for 2D radial cine MRI with limited training data." IEEE transactions on medical imaging 39.3 (2019): 703-717.

Nezafat, Maryam, et al. "Deep convolution neural networks based artifact suppression in under-sampled radial acquisitions of myocardial T 1 mapping images." Physics in Medicine & Biology 65.22 (2020): 225024. (Abstract Only).

Fan, Lexiaozi, et al. "Rapid dealiasing of undersampled, non-Cartesian cardiac perfusion images using U-net." NMR in Biomedicine 33.5 (2020): e4239.

Shen, Daming, et al. "Rapid reconstruction of highly undersampled, non-Cartesian real-time cine k-space data using a perceptual complex neural network (PCNN)." NMR in Biomedicine 34.1 (2021): e4405.

Chen, D., et al. "Ground-truth-free deep learning for artefacts reduction in 2D radial cardiac cine MRI using a synthetically generated dataset." Physics in Medicine & Biology 66.9 (2021): 095005. (Abstract Only).

Terpstra, Maarten L., et al. "Deep learning-based image reconstruction and motion estimation from undersampled radial k-space for real-time MRI-guided radiotherapy." Physics in Medicine & Biology 65.15 (2020): 155015.

El-Rewaidy, Hossam, et al. "Multi-domain convolutional neural network (MD-CNN) for radial reconstruction of dynamic cardiac MRI." Magnetic Resonance in Medicine 85.3 (2021): 1195-1208.

Fessler, Jeffrey A. "On NUFFT-based gridding for non-Cartesian MRI." Journal of magnetic resonance 188.2 (2007): 191-195.

Parmar, Niki, et al. "Image transformer." International conference on machine learning. PMLR, 2018.

Dosovitskiy, Alexey, et al. "An image is worth 16×16 words: Transformers for image recognition at scale." arXiv preprint arXiv:2010.11929 (2020).

Seiberlich, Nicole, et al. "Improved radial GRAPPA calibration for real-time free-breathing cardiac imaging." Magnetic resonance in medicine 65.2 (2011): 492-505.

He, Kaiming, et al. "Deep residual learning for image recognition." In Proceedings of the IEEE conference on computer vision and pattern recognition, pp. 770-778. 2016.

Ba, Jimmy Lei, Jamie Ryan Kiros, and Geoffrey E. Hinton. "Layer normalization." arXiv preprint arXiv:1607.06450 (2016).

Paszke, Adam, et al. "Automatic differentiation in pytorch." (2017).

Ronneberger, Olaf, Philipp Fischer, and Thomas Brox. "U-net: Convolutional networks for biomedical image segmentation." International Conference on Medical image computing and computer-assisted intervention. Springer, Cham, 2015.

Xiang, Lei, et al. "Deep-learning-based multi-modal fusion for fast MR reconstruction." IEEE Transactions on Biomedical Engineering 66.7 (2018): 2105-2114.

Hu, Jie, Li Shen, and Gang Sun. "Squeeze-and-excitation networks." Proceedings of the IEEE conference on computer vision and pattern recognition. 2018.

* cited by examiner

Spiral trajectory    FIG. 9A    Rearranged k-space

Multi-shot EPI trajectory

Rearranged k-space

METHOD AND APPARATUS FOR ACCELERATED ACQUISITION AND ARTIFACT REDUCTION OF UNDERSAMPLED MRI USING A K-SPACE TRANSFORMER NETWORK

CROSS-REFERENCE TO RELATED APPLICATION

This application claims the benefit of U.S. Provisional Application Ser. No. 63/363,320 titled "Method and Apparatus for Accelerated Acquisition and Artifact Reduction of Undersampled MRI Using A k-Space Transformer Network" filed Apr. 21, 2022, which is hereby incorporated herein by reference in its entirety.

BACKGROUND

Magnetic Resonance Imaging (MRI) has been widely used for non-invasive diagnosis due to its high resolution and excellent soft tissue contrast. However, its long acquisition time is a drawback and predisposes to artifacts due to patient movement. Undersampling is an efficient way to shorten the acquisition time but the undersampling process itself may produce artifacts and degrade image quality. In the past decades, methods such as compressed sensing (CS) use sparsity constraints to reconstruct images but CS typically suffers from long computational time. The recent development of deep learning combined with CS acquisition schemes enabled fast acquisition and fast reconstruction and achieved state-of-the-art performance on Cartesian trajectories for MRI.

One way to speed up the MRI acquisition time is to undersample the k-space data. When undersampling, one must be cognizant of the Shannon-Nyquist sampling theorem. When the signal frequency is higher than the Nyquist limit of the sampling rate, aliasing occurs. One of the practical approaches to accelerate the imaging process is violating the Shannon-Nyquist sampling theorem by acquiring fewer lines and reconstructing the artifact-free images from the acquired spokes by using the prior condition, e.g., incoherency in the sampling pattern and redundant information in the temporal or channel direction of the data.

Enforcing k-space data consistency in deep learning-based CS reconstruction is straightforward and time-efficient for Cartesian trajectories, which only needs forward and inverse Fourier transforms between k-space and image space. However, for non-Cartesian trajectories, the non-Cartesian k-space typically needs to be gridded onto a Cartesian basis prior to Fourier transformation. Gridding is time consuming and typically needs to be performed with each iteration of the network training and testing, which slows down the process profoundly and offsets the deep learning advantage of fast inference. For image-to-image networks, the generated images may lack k-space data consistency and therefore compromise image fidelity. Gridding non-Cartesian k-space before the network training can avoid the repeated gridding problem, but networks have difficulty learning to compensate for the gridding error. In addition, the artifacts due to radial k-space undersampling manifest in the images as global streaks which are hard to remove in the image domain with local convolution kernels.

Predictive model image enhancement has typically been handled by convolutional neural networks (CNN). Recently, there has been several developments in transformer neural networks. Transformer networks were originally proposed for predictive linguistic modeling. See, e.g., Vaswani, et al., "Attention is all you need," ("Vaswani 2017") Advances in neural information processing systems 30 (2017). Transformer networks have recently proven useful in image generation and reconstruction. See, e.g., Parmar, et al. "Image transformer" International Conference on Machine Learning. pp. 4055-4064. PMLR (2018). However, existing techniques have proven unsuitable for handling artifacts from undersampled radial MRI imaging. For example, transformer techniques have been proposed that crop the image and reshape the image patches to sequential vectors where each vector is a token. See, e.g., Dosovitskiy, et al. "An image is worth 16×16 words: Transformers for image recognition at scale" arXiv:2010.11929 (2020). However, cropping and reshaping the image will cut off the global streaking artifacts and make the network less effective at removing them. Accordingly, existing implementations of transformer networks have not been suitable for generating accurate images from undersampled radial MRI imaging.

SUMMARY

Described herein are systems and methods for removing or reducing artifacts within undersampled MRI data sets, including MR images. In one aspect, a system for recreating images from undersampled MRI image data includes an MRI imaging system having a plurality of magnets and RF coils configured to acquire undersampled radial MRI k-space data comprising acquired radial lines. The imaging system further includes a processor and memory configured to execute software instructions that implement one or more transformer networks that is trained to predict additional projected radial MRI k-space data from the undersampled radial MRI k-space and to generate MRI images from the projected radial MRI k-space data and undersampled radial MRI k-space data.

According to some embodiments, the processor and memory are further configured to pass the undersampled radial MRI k-space data to the one or more transformer networks in an order corresponding to a chronological order in which radial lines were captured. In some embodiments, the one or more transformer networks comprise three independent transformer networks, each trained to predict a number of radial lines of k-space data at predetermined angles, the number being equal to a number of radial lines in the undersampled radial MRI k-space data. In some embodiments, the number of acquired radial lines is substantially around 100. In some embodiments, the processor and memory are further configured to convert the projected radial MRI k-space data and undersampled radial MRI k-space data to an image using a transform function. In some embodiments, the processor and memory are further configured to pass the undersampled radial MRI k-space data to the one or more transformer networks including both real and imaginary values. In some embodiments, the one or more transformer networks comprise a predetermined number of encoder blocks and a predetermined number of decoder blocks. Each encoder block comprises a self-attention layer and a feed-forward neural network and each decoder block comprised a feed-forward neural network and a two self-attention layers, one determining attention values between past outputs of decoder blocks and one determining attention values between outputs of encoder blocks.

According to another aspect, a method for recreating images from undersampled MRI image data includes steps to: acquire undersampled radial MRI k-space data using an MRI imaging system comprising a plurality of magnets and RF coils; implement one or more transformer networks that is trained to predict additional projected radial MRI k-space data from the undersampled radial MRI k-space; predicting, using one or more transformer networks that are implemented by a processor and memory, additional projected radial MRI k-space data from the undersampled radial MRI k-space data; and generate MRI images from the projected radial MRI k-space data and undersampled radial MRI k-space data.

BRIEF DESCRIPTION OF THE DRAWINGS

The accompanying drawings, which are incorporated in and form a part of the specification, illustrate the embodiments of the invention and together with the written description serve to explain the principles, characteristics, and features of the invention. In the drawings:

FIGS. 9A and 9B are logical diagrams of k-space arrangements that can be used alternatively to those shown in FIG. 3.

DETAILED DESCRIPTION

Figure 1:
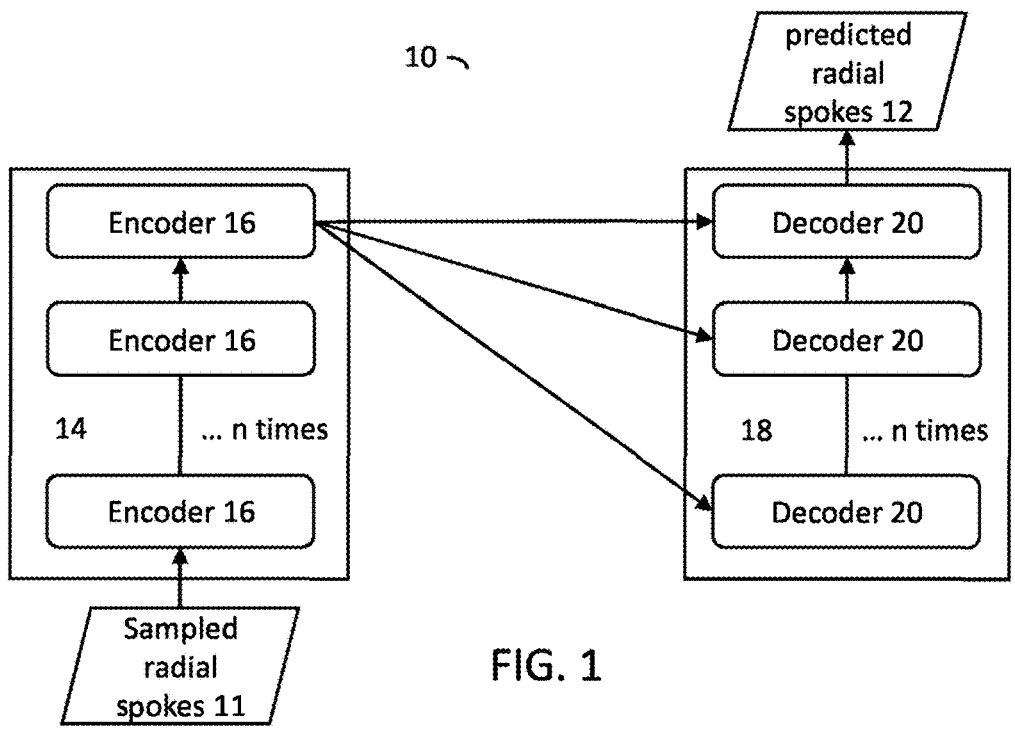
FIG. 1 is a block diagram of an exemplary transformer network for use with some embodiments.

This disclosure is not limited to the particular systems, devices and methods described, as these may vary. The terminology used in the description is for the purpose of describing the particular versions or embodiments only and is not intended to limit the scope.

As used herein, the terms "algorithm," "system," "module," or "engine," if used herein, are not intended to be limiting of any particular implementation for accomplishing and/or performing the actions, steps, processes, etc., attributable to and/or performed thereby. An algorithm, system, module, and/or engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, and/or engine may be equally performed by multiple algorithms, systems, modules, and/or engines, incorporated into and/or combined with the functionality of another algorithm, system, module, and/or engine of the same or different type, or distributed across one or more algorithms, systems, modules, and/or engines of various configurations.

As used herein, the terms "MM sequence," "pulse sequence," or "MM pulse sequence" are interchangeable and can include a particular combination of pulse sequences and/or pulsed field gradients that result in a particular set of MRI data. An MRI sequence can be used either individually or in combination with one or more other MRI sequences (i.e., multi-parametric MRI).

As used herein, the term "MRI data" can include an MRI image or any other data obtained via MRI (e.g., biomarker data or a parameter map). An MRI image can include a three-dimensional image or a two-dimensional image (e.g., a slice of a three-dimensional image).

To avoid the repeated gridding process in training, some embodiments use deep-learning-based transformer network to directly predict unacquired radial k-space spokes. This leads to shortened acquisition time, artifact reduction and improved image quality.

Existing radial GRAPPA techniques aim to fill the missing radial spokes using the information from acquired ones. Seiberlich, N., Ehses, P., Duerk, J., Gilkeson, R., Griswold, M.: Improved radial GRAPPA calibration for real-time free-breathing cardiac imaging. Magnetic resonance in medicine 65(2), 492-505 (2011). Embodiments also fill the missing radial spokes using the information from acquired ones. However, existing radial GRAPPA techniques use local reconstruction kernels and a k-space center calibration region to utilize the multi-coil information. They do not utilize the global k-space information and only work with radial spokes that are separated by the same angle. In contrast, some embodiments rearrange the radial k-space to sequential data based on the chronological order of acquisition and use the attention mechanisms to learn the dependencies between arbitrary locations of radial spokes.

Embodiments are believed to be the first to translate MRI k-space into sequential time-series data and to use the Transformer network for MRI raw data prediction and image reconstruction. Some embodiments use the golden-angle (i.e., 111.25°) stack-of-radial trajectory to sample the k-space, which is then used by a projection-based k-space Transformer network to efficiently predict the fully-sampled radial k-space.

Transformer networks were first proposed for natural language processing and translation applications but can be applied to image prediction for undersampled images, as shown in various embodiments. A basic transformer network 10 is shown in FIG. 1. In various embodiments, the trained network 10 can be operated on k-space data and can take as input sampled/acquired radial spokes 11, encode each spoke in accordance with the trained model, and decode the data in the model to recreate accurate predicted radial spokes 12, which correspond to radial angles that were not acquired.

Sampled spokes 11 are fed into encoder 14, which has n cascading encoder blocks 16. These then send values to n cascading decoder blocks 20 in decoder 18. In some embodiments, n=6, although any suitable number can be used.

Figure 2A:
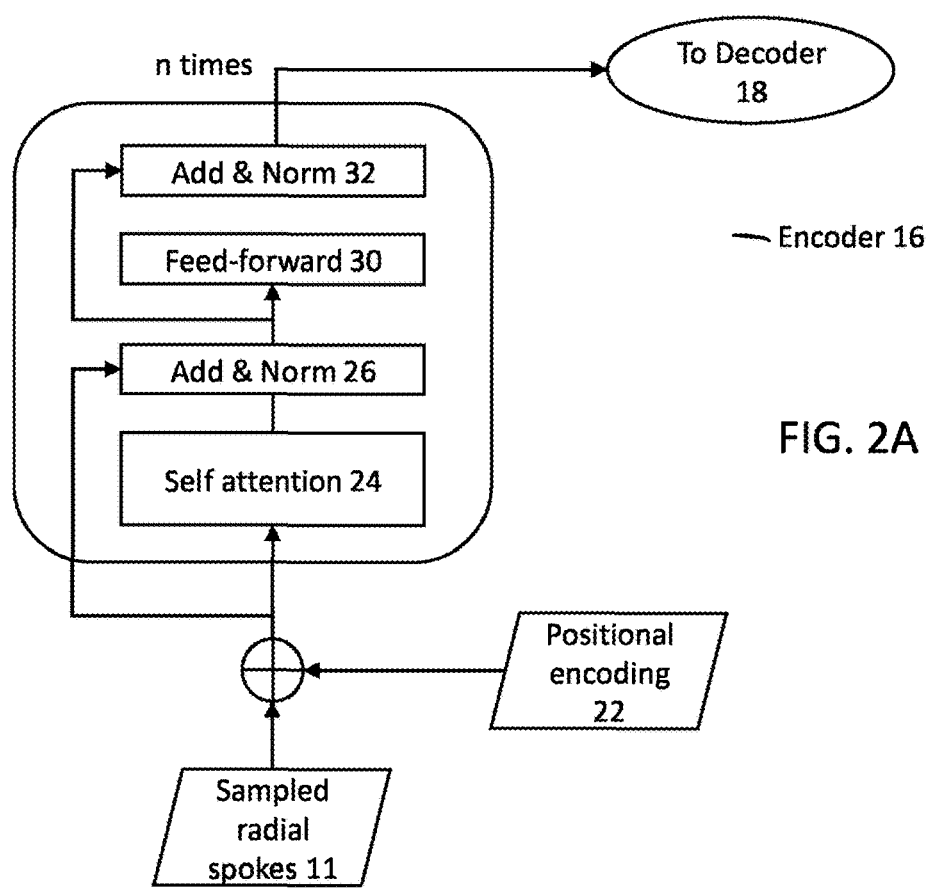
FIG. 2A is a block diagram of an exemplary encoder of a transformer network for use with some embodiments.

Each encoder block is identical to the others, but has unique learned weight/values, and is composed of two basic blocks-a self-attention block and a feed forward neural network. FIG. 2A illustrates the encoder concept. Encoder block 16 is replicated n times. Each encoder receives sampled spoke data 11 and positional encoding information 22, which identifies vector distance/position information about the spoke data, but not relationship information, as the network will learn this in the self-attention layer 24 during training. The self-attention layer helps the encoder look at other spokes in the input data 11 as it encodes each specific spoke. This is accomplished by calculating a normalized score of relevance. Additional details on how self-attention layers, as known in the art, accomplish this can be found in Vaswani 2017. Self-attention layer 24 is generally a multi-headed attention layer.

The outputs of the self-attention layer are fed to a feed-forward neural network 30. After each layer is an addition and layer-normalization block (26 and 32, respectively) that uses the output of each layer to modify the input vectors by adding the output of each layer and normalizing before sending to the next layer. The same feed-forward network is independently applied to each position.

An encoder receives a list of vectors as input. It processes this list by passing these vectors into the self-attention layer 24, then into feed-forward neural network 30 (via addition and normalization block 26), then sends out the output upwards to the next encoder (via addition and normalization block 32), and eventually the output of the last encoder is sent to each decoder block 20 in decoder 18.

Figure 2B:
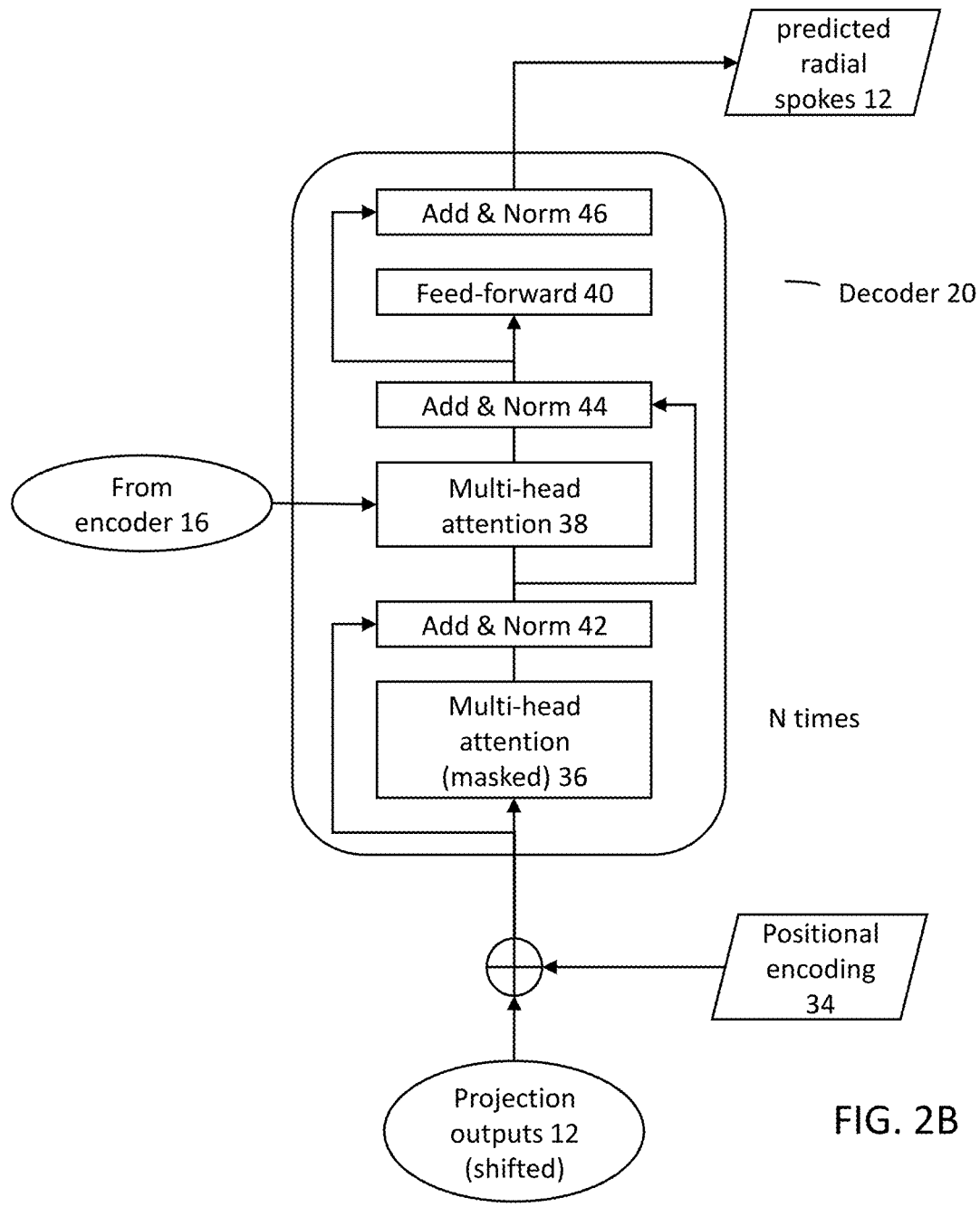
FIG. 2B is a block diagram of an exemplary decoder of a transformer network for use with some embodiments.

As shown in FIG. 2B decoder block 20 has two attention layers to consider the relationships of the encoder outputs and the outputs of the decoder from previous iterations. As outputs 12 are generated by a decoder 18, they are input back into decoder 12, along with positional encoding information 34, similar to the inputs of the encoder block. These are combined and sent to attention layer 36, which is generally multi-headed and can be described as a masked attention layer, as it masks the projection outputs that haven't been predicted yet. Attention layer 36 feeds into attention layer 38, which is also multiheaded. Attention layer 38, also receives input from the output of encoder 16. The results of attention layer 38 are fed into a feed-forward network 40, which creates an output that cascades to additional decoder blocks, eventually producing the projection output of predicted radial spokes 12. After each layer in decoder block 20, an addition and normalization block prepares the data for each block as mentioned above in encoder block 16.

Exemplary embodiments use a golden-angle-ordered radial k-space undersampled acquisition (shown as an example in FIG. 3), although any suitable MRI k-space data acquisition strategy can be used. Starting from 0°, each radial k-space spoke in undersampled k-space 30 is rotated by a golden angle, which is approximately 111.25°. In this example, five spokes are illustrated (labeled in time order 1-5), but it should be appreciated that many more spokes will be captured in practice, more than 100 in most embodiments. In some embodiments, substantially around 100 spokes (95-110) are captured, such that around 400 total spokes are captured or generated, making the resulting data set equivalent in size to existing fully-sampled radial capture schemes. The golden-angle acquisition ensures uniform coverage of the k-space for any arbitrary number of consecutive spokes so any newly acquired radial spoke is interleaved with the acquired ones. The spokes that are physically close (in azimuth angle) are dependent on each other. The angular dependencies between each of the spokes need not be given to a transformer network and can be learned by the attention modules in a transformer network to predict unacquired spokes and identify those acquired spokes that are most relevant to each spoke being predicted. For this reason, acquired spokes can be input to the network in any order. Some embodiments, rearrange the radial spokes based on the chronological order of acquisition and encode the temporal spoke index in the network. Note that the same concept can be extended to other non-Cartesian k-space trajectories such as the spiral trajectory or uniform-angle ordering.

Graphs 32 and 34 show pre-processing steps of radial k-space. For each single coil 2D slice, the golden-angle-ordered radial spokes are rearranged based on the chronological order of acquisition. The spokes in undersampled k-space 30 include a real part 35 and an imaginary part 36. These spokes can be ordered in any reasonable manor along an x-axis, representing the inputs to the transformer network, due to the self-attention layers in the network. In some embodiments, these are input in a chronological order. In some embodiments, the spokes can be ordered for 0-360 degrees. Graph 32 shows the simple case where spokes are arranged in chronological order, and only the real part 35 is input into the network. However, the transformer network can also process and predict the imaginary part of the k-space. Thus, in some embodiments, the input to the network is shown in graph 34, where the real part 35 is concatenated with the imaginary part 36 of each spoke, representing each spoke as a longer vector. In some embodiments, each of the k-space spokes is inverse Fourier transformed to generate a projection vector at each angle. The projection signals span the whole image compared to the centrally condensed k-space signals, so the network can better learn the image details and the reconstructed image is less sensitive to network errors. In some embodiments, the real and imaginary parts of each complex-valued projection are concatenated to a single long vector prior to input to the network. Because the frequency encoding line ($k_x$) is typically two-times oversampled, the complex-valued projection vector is of length 512 and the concatenated projection vector is of length 1024. The input and output are of size 1024×100 with each projection vector as a token in the network.

Once the network has projected the remaining spokes in the k-space, the output of the predicated k-space looks like fully-sampled estimated k-space 40, which includes interleaved sets of spokes, including undersampled spokes 30 and projects sets of spokes 36, 37, and 38. The angular spacing between each spoke can be predetermined when training the network so that there is uniform coverage of the k-space with the resulting combination of sampled and predicted k-space spokes. In real examples, there would be closer to or more than 100 spokes, but only five are used here in each set to illustrate the concepts.

Suppose there are 256 sampling points along each spoke, a fully-sampled radial k-space needs $256*\pi/2\approx402$ spokes according to the Nyquist sampling requirement. Some embodiments aim to achieve four or more times undersampling. Thus, illustrative embodiments set the number of spokes of the input to be 100 and the output has 300 new spokes to supplement the acquired ones, but any suitable numbers can be chosen. Some embodiments implement and train three independent transformer networks, each predicting 100 consecutive spokes of different angles.

In some embodiments, to reconstruct the final images, the radial k-space is nonuniformly fast Fourier transformed (NUFFT) and the images from different coils are combined using adaptive coil combination. Other embodiments can use any other suitable software package for image reconstruction.

Figure 3:
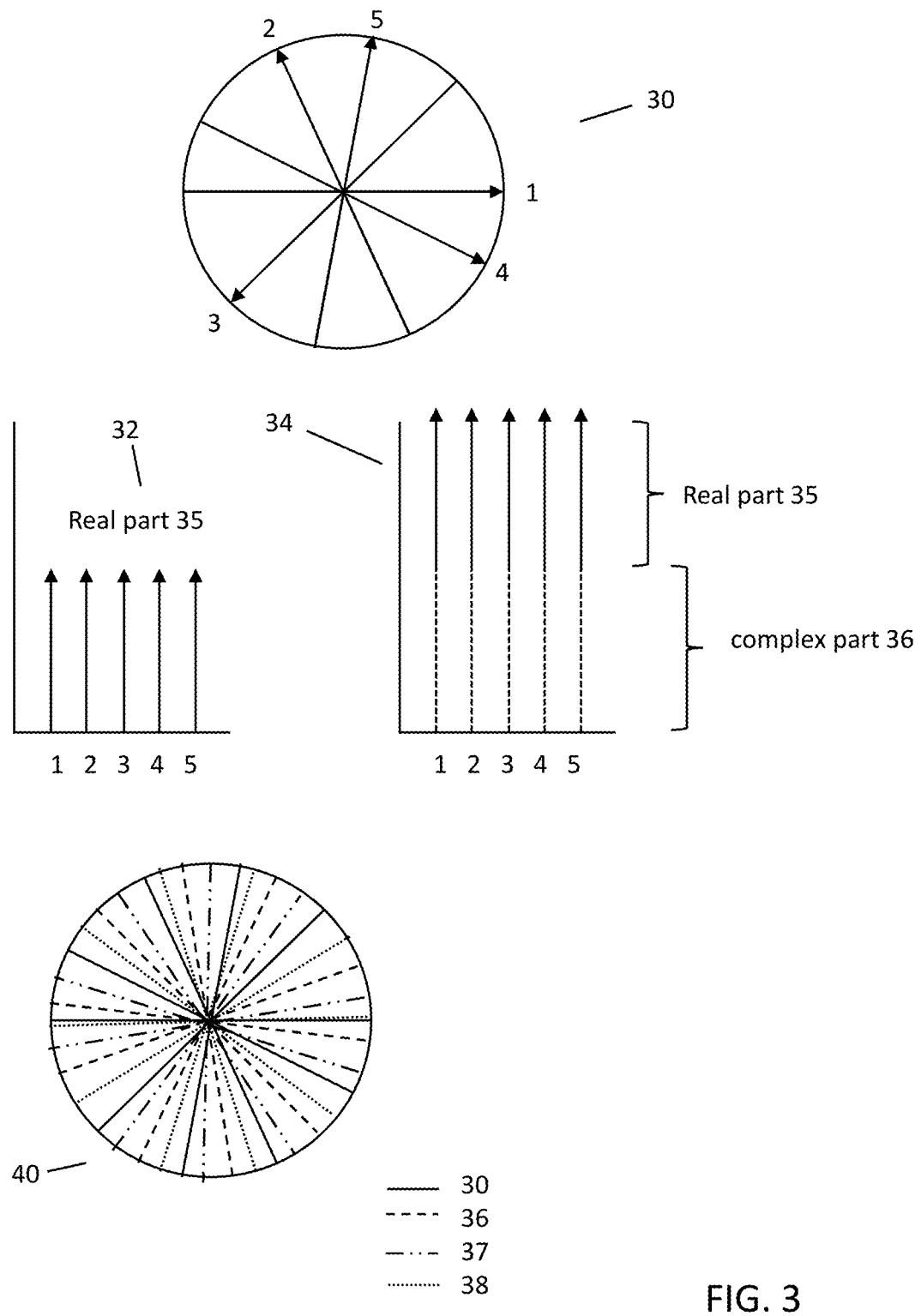
FIG. 3 is an abstract representation of inputs and outputs of a transformer network for use with some embodiments.
Figure 4:
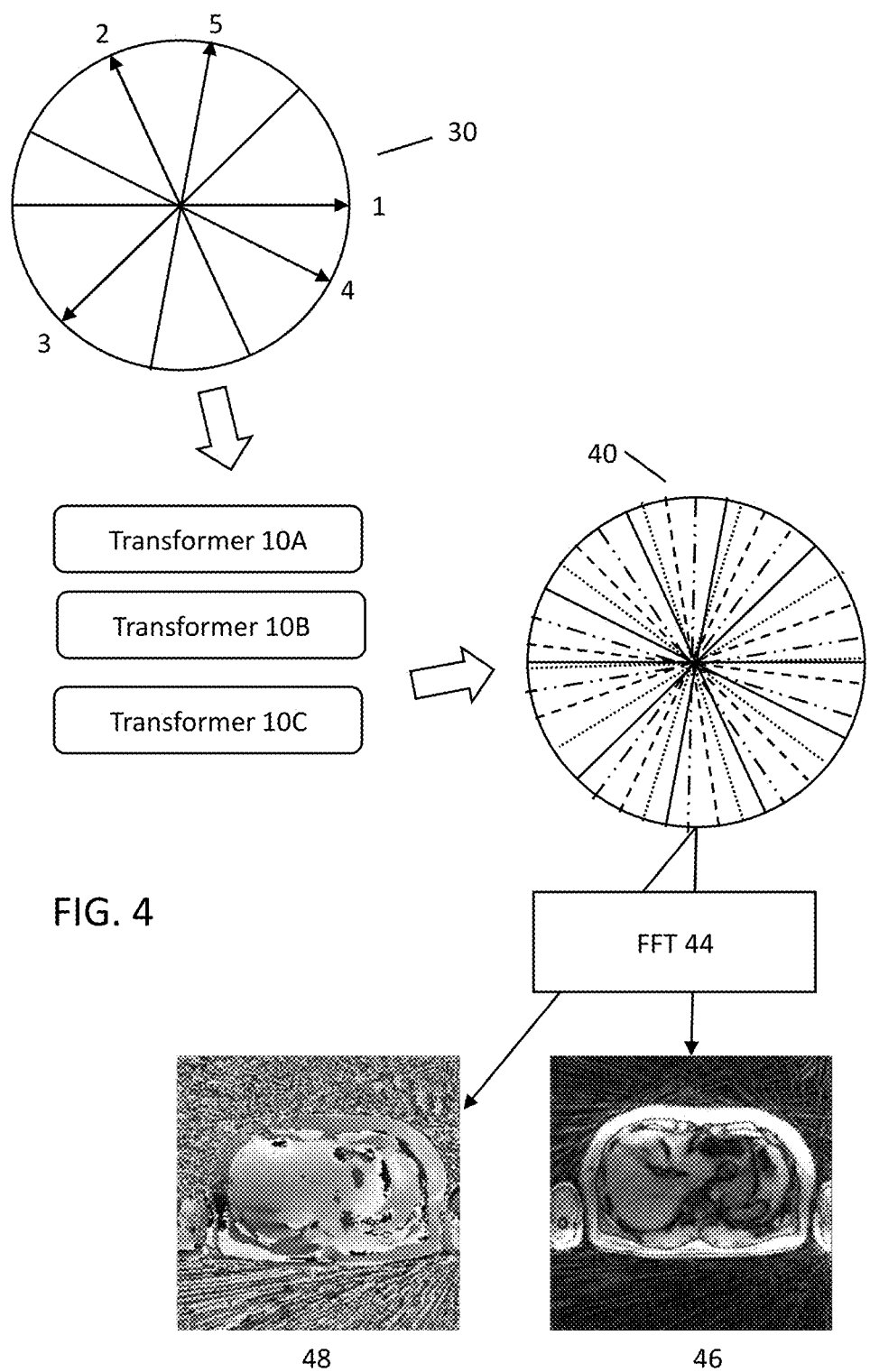
FIG. 4 is a dataflow diagram illustrating the dataflow of undersampled k-space data to fully-filled k-space data and images in accordance with some embodiments.

FIG. 4 illustrates the entire process. Exemplary undersampled radial k-space 30 has 100 spokes ($p_i$, $p_{i+1}$, ..., $p_{i+99}$) (where only 5 are shown for clarity) where i is the spoke index of the first spoke in each sequential set of spokes. Transformers 10A, 10B, and 10C (all instances of transformer network 10) receive these sampled radial spokes as input (as preprocessed in accordance with the arrangement of graphs 32 or 34) and predict unacquired k-space radial spokes independently and in parallel. Spokes ($p_{i+100}$, $p_{i+101}$, ..., $p_{i+199}$), ($p_{i+200}$, $p_{i+201}$, ..., $p_{i+299}$), and ($p_{i+300}$, $p_{i+301}$, ..., $p_{i+399}$) (corresponding to exemplary predicted outputs 36, 37, and 38 in FIG. 3) are the outputs of transformers 10A, 10B, and 10C, respectively. The corresponding spoke indices are encoded in the transformer network to distinguish spokes at different angles. The input 30 and three outputs 36, 37, and 38 are combined in the order of the spoke index to form a fully-sampled radial k-space 40. The resulting k-space can be transformed using a Fourier transform to generate fully sampled magnitude image 46 or fully sampled phase image 48.

Figure 5:
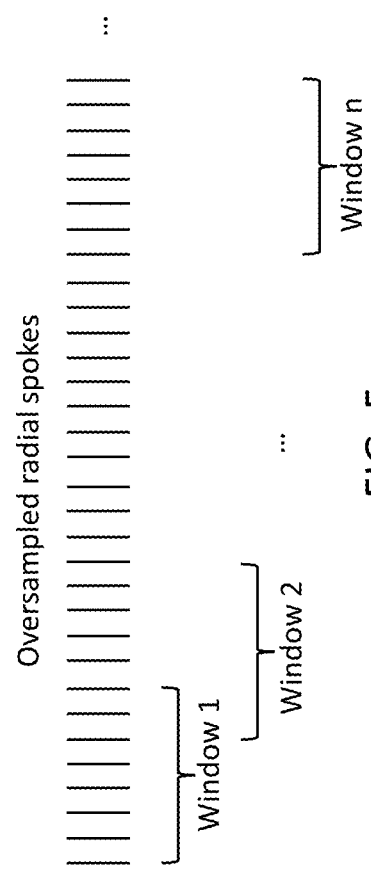
FIG. 5 is an illustration of a sliding window data augmentation training technique.

Generally, large training data are necessary to train deep learning networks, which can pose practical challenges. With the proposed k-space transformer framework, several data augmentation methods were used to enlarge the training data size with limited subjects. The data augmentation methods used in this work include (1) acquisition from multiple anatomical regions, (2) over-sampled 3D multi-coil acquisition and (3) a sliding window approach to generating more training data. Scanning from multiple anatomical regions not only enlarges the data size but also increases the data diversity and can help the generalization of the network on various anatomical images. Each 3D multi-coil acquisition is first inverse fast Fourier transformed (FFT) along kz to generate multi-coil multi-slice 2D radial k-space. Because each slice has over-sampled k-space data, a sliding window approach was used to generate more training data from the same single-coil slice, as illustrated in FIG. 5. Each window contains 400 spokes and the step size is 200 spokes. Suppose $n_{sub}$ subjects are acquired for training, $n_{reg}$ anatomical regions for each subject, $n_{slc}$ slices and $n_{coil}$ coils for each 3D acquisition, and M spokes for each slice, the effective training data size DS will be:

$$DS = n_{sub} \lambda n_{reg} \lambda n_{slc} \lambda n_{coil} \times \lfloor M/400 \rfloor \quad (1)$$

where $\lfloor \; \rfloor$ represents the floor function.

Considering the relatively long length of sequential radial spokes, the application of the Transformer network is expected to learn the long-range dependencies between the spokes. As shown in FIG. 1, the Transformer has an encoder/decoder structure. The encoder maps an input of the acquired radial spokes to sequential representations, which was used by the decoder to generate the sequential output. Each spoke is treated as a token in the network. At each step the decoder is auto-regressive, using the previously generated spokes to generate the next single spoke. The encoder consists of N=6 identical stacks, each having a multi-head self-attention sub-layer and a fully connected feed-forward sublayer. After each sub-layer, a residual connection is implemented followed by layer normalization. The decoder also has N=6 identical stacks. In addition to the two sub-layers in encoder, the decoder has a third sub-layer, which learns the multi-head attention from the outputs. The output is offset by one position and is masked for each iteration so that the prediction for position pos depends only on the known outputs at positions less than pos.

The angle information of the radial spokes is highly correlated with their dependency. Therefore, positional encoding is implemented for the input and output to make use of the angle information. In one embodiment, for a set of consecutive spokes ($k_1$, ..., $k_n$) each having a length of $d_{model}$, the positional encoding is calculated using sine and cosine functions:

$$PE_{i_s, 2j} = \sin(i_s/10000_{2j/d_{model}})$$

$$PE_{i_s, 2j+1} = \cos(i_s/10000_{2j/d_{model}}) \quad (2)$$

where $i_s$ is the relative spoke index and $i_s \in \{0, 1, \ldots, 399\}$ and j is the dimension. The positional encoding is directly added to the input and output. Using this positional encoding strategy, consecutive input and output are not necessary which allows more flexibility for the network design. For example, when the input is ($k_1$, ..., $k_n$), it is not necessary for the output to be ($k_{n+1}$, ..., $k_{2n}$) only, where ($k_m$, ..., $k_{m+n-1}$) is also feasible (m>n). This strategy allows to train independent transformers to predict spokes at different angles and combine all predictions and the input for the final reconstruction.

Experimental Results

A study of certain embodiments was completed. It was compliant with the Health Insurance Portability and Accountability Act and approved by the Institutional Review Board. With written informed consent from each subject, the study acquired radial MRI data using a prototype golden-angle, gradient-echo stack-of-radial sequence from 17 healthy subjects in the abdomen, pelvis, thigh and leg (16 subjects on a 3T MAGNETOM Prismafit and 1 subject on a 3T MAGNETOM Skyra, Siemens Healthcare, Erlangen, Germany). The sequence parameters were: 512 sampling points each spoke (with 2×oversampling along frequency encoding direction), 3500 spokes per partition and 32 partitions. For each subject, images were acquired at 3 regions on average and each acquisition had around 30 coils. The reference images were acquired with oversampling with 3500 radial spokes and were retrospectively downsampled to generate undersampled images.

The study divided the data into training (8 subjects), validation (2 subjects) and testing (7 subjects) datasets. Although the number of subjects was relatively small in this study, the generated data size was considerably large, comprising 193536 training data, 61440 validation data and 11968 testing data.

The proposed network was modified based on the transformer network. The transformer consisted of an encoder and a decoder, each consisting of N multi-head attention and feed forward modules. The multi-head attention module used queries, keys and values to learn the correlation between each input k-space spoke. Positional encoding of the input and output represented the azimuthal angle index of each radial spoke. Mean-squared-error (MSE) loss was used for training.

The study used Mean-Squared-Error (MSE) loss, i.e., l2 loss, to minimize the distance between the output and the ground truth:

$$\min_\theta L_{l_2}(\theta) = \|T_\theta(x) - y\|_2^2 \quad (3)$$

where θ represents the network parameters, T represents the Transformer, x is the input and y is the ground truth. Implementation and training of the proposed network were completed in Python 3.7.7 (Python Software Foundation) using the Pytorch library 1.8.1 [26] on a computer with three NVIDIA Quadro RTX 8000 GPUs. The networks were trained for 100 epochs with a batch size of 400. An Adam optimizer with $\beta_1=0.9$, $\beta_2=0.98$, and $\epsilon=10^{-9}$ was used. The hyperparameters were $d_{model}=1024$, 16 attention heads, dimensions of keys and values $d_k=64$, $d_v=64$, dropout=0.1. The total training time was around 3 days. The reference data containing 400 spokes was regarded as the full k-space acquisition and was used to reconstruct the reference standard image. The total training time was 58 hours.

The reference data containing 200 spokes was regarded as the full k-space acquisition and was used to reconstruct the reference standard image. The 100 spokes from the input and the 100 spokes from the output were combined to form a complete k-space to reconstruct the output image. All images were NUFFT reconstructed using the Bart toolbox and adaptive coil combination. Comparison on both the k-space data and the reconstructed images were performed by calculating the differences between the output and the reference.

For quantitative evaluation, the study used Normalized MSE (NMSE), peak signal-to-noise ratio (PSNR) and structural similarity index (SSIM) between the reconstructed images and the reference images. NMSE was also calculated for the projection data. All images were normalized by the 90th percentile before the assessment. Statistical differences between the proposed projection-based k-space transformer network (PKT) and the baseline methods were assessed using a one-way ANOVA model with the reconstruction method being the independent variable.

As representative state-of-the-art techniques, the study also trained image-based U-Net, DenseUnet and SEUnet to compare with our proposed PKT network. DenseUnet used dense connections between U-Net layers and SEUnet added channel-wise attention modules to the U-Net. The study reconstructed 2D images with 100 and 400 spokes as the input and output images, respectively. In this example, all network training were completed in Python 3.7.7 using the Pytorch library 1.8.1 on a computer with a NVIDIA V100 GPU. The initial learning rate was 0.0001 which was reduced with a factor of 0.7 if no improvement shown in 200 iterations. The training was stopped when the learning rate was below $1\times10^{-6}$ or the max epoch number reached 100.

Normalized MSE (NMSE) and structural similarity index (SSIM) were used to quantitatively evaluate the images with respect to the reference. Region-of-interest (ROI) analysis was performed by calculating mean and standard deviation (SD) of two ROIs in three slices in liver dome, mid-liver and inferior liver. Coefficient of variation (CV=SD/mean) was further calculated to evaluate the streaking artifacts.

Figure 6A:
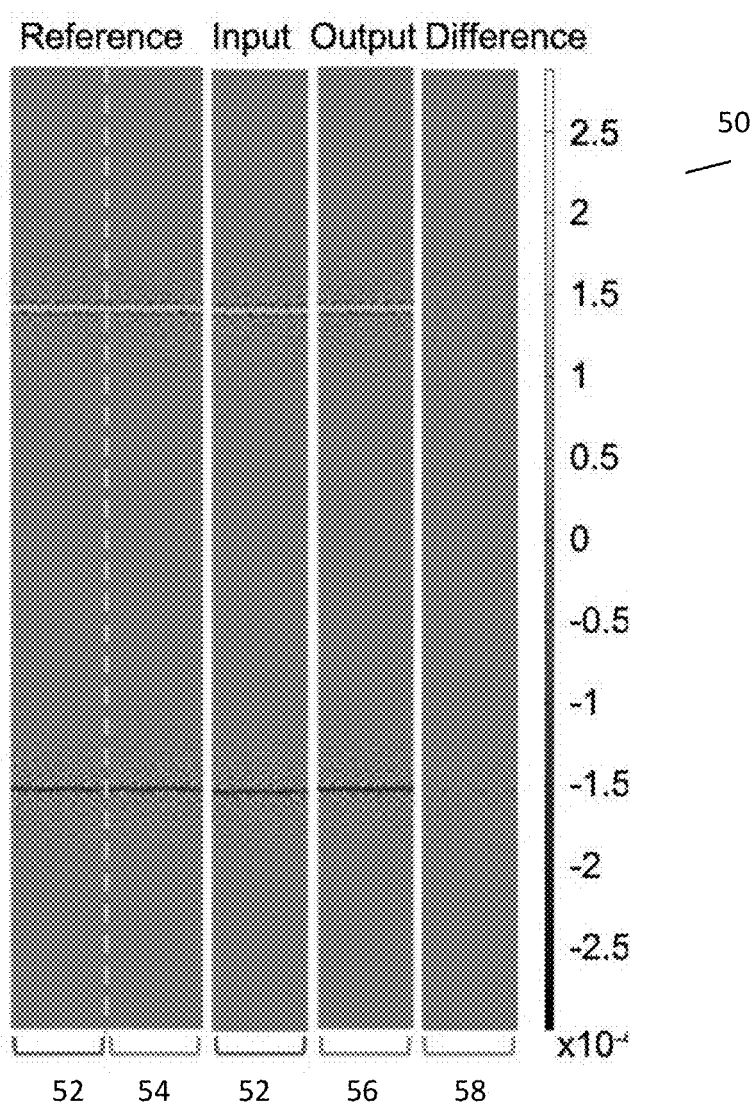
FIG. 6A is an example of qualitative inputs/outputs of a transformer network, in accordance with some embodiments.

FIG. 6A shows an example of the network predicted k-space data 50 compared with the input and the reference standard. For each column, the top half is the real part of the k-space and the bottom half is the imaginary part of the k-space. The input is the same as the early half (52) of k-space in reference (100 radial spokes) and the output (56) is the radial spokes predicted by the network corresponding to the late half of k-space (54), and reserved to compare the predicted k-space data. The fourth column (58) shows the difference between the output of the network (56) and the late half of the reference (100 radial spokes) (54).

Figure 6B:
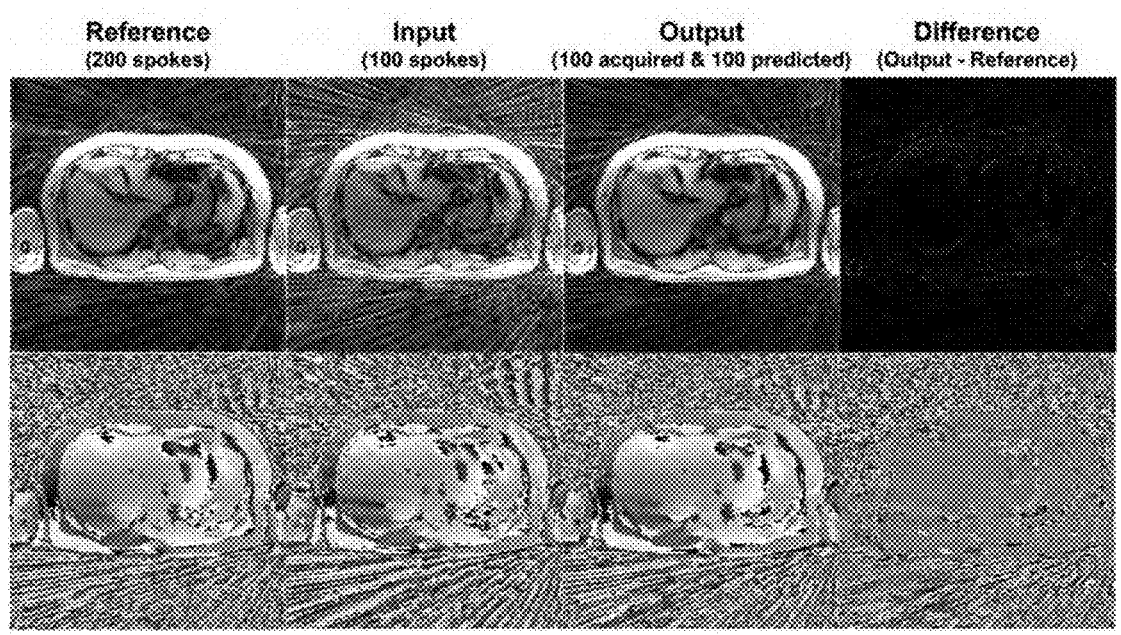
FIG. 6B is an example of image-equivalent inputs/outputs of a transformer network, in accordance with some embodiments, to illustrate the effectiveness of embodiments.

FIG. 6B shows the same example of FIG. 6A as the reconstructed images (processed by FFT) using the transformer generated k-space data. The reference has 200 radial spokes, the input has 100 radial spokes, and the output has 100 acquired spokes and 100 predicted spokes. The top row shows the magnitude images, and the bottom row shows the phase images. The difference images show the differences between output and reference images. The reference, output and difference images have the same window/level.

Figure 6C:
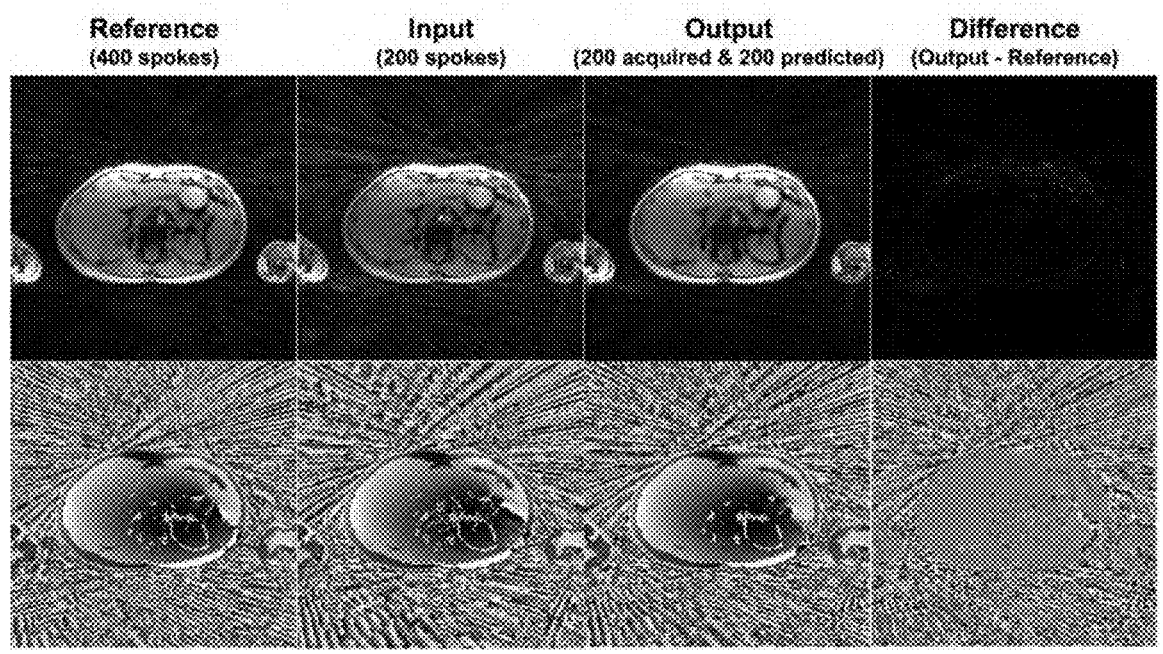
FIG. 6C is an example of image-equivalent inputs/outputs of a transformer network, in accordance with some embodiments, to illustrate the effectiveness of embodiments.

FIG. 6C shows another example of the reconstructed images. The reference has 400 radial spokes, the input has 200 radial spokes, and the output has 200 acquired spokes and 200 predicted spokes. The top row shows the magnitude images, and the bottom row shows the phase images. The difference images show the differences between output and reference images. The reference, output and difference images have the same window/level. The images reconstructed with the predicted k-space greatly reduce the streaking artifacts compared to the input images and achieve very similar image appearance to the reference images.

Representative abdominal and pelvis images of the proposed PKT compared with baseline reconstructions and the reference images. The proposed PKT successfully removed the streaking artifacts and improved signal-to-noise in the magnitude and phase abdominal images compared to the other reconstructions. Study results show that the PKT reconstruction can also be applied to the pelvis region to reduce streaking artifacts and noise.

The NMSE of all testing projection data is 0.0385±0.0497. Quantitative evaluations of the proposed PKT network compared with baseline reconstructions with respect to the reference images are shown in Table 1. The proposed PKT have a significantly lower NMSE (p<0.0001) and significantly higher PSNR (p<0.0001) and SSIM (p<0.0001) compared to all other reconstructions. The results indicate that the proposed PKT reconstructed images had fewer streaking artifacts and less noise compared to the other methods.

In one part of the study, the proposed method had lower NMSE values (0.0282±0.0073) than the input (0.2133±0.0079) and higher SSIM values (0.8878±0.0360) than the input (0.7853±0.0434), compared to the reference. The input had a lower signal mean in the liver (148.00±31.42) compared to the reference (287.85±63.16), likely due to the lower signal-to-noise ratio (SNR) by fewer radial spokes, and the proposed method increased the signal mean in the liver (288.29±61.01) and was similar to the reference. As a measure of the streaking artifacts, the input had a higher CV in the liver (0.11±0.03) compared to the reference (0.07±0.02) and the proposed method (0.07±0.02) reduced the variation and was similar to the reference. Table 1 shows some exemplary results of the different methods used, and the performance of a PKT.

TABLE 1

| Methods | NMSE | PSNR | SSIM (%) |
| --- | --- | --- | --- |
| Zero-filled | 0.1389 ± 0.0275 | 27.28 ± 2.10 | 59.19 ± 5.25 |
| U-Net | 0.0755 ± 0.0527 | 30.44 ± 2.87 | 71.81 ± 6.23 |
| DenseUnet | 0.0765 ± 0.0443 | 30.28 ± 2.87 | 67.20 ± 6.16 |
| SEUnet | 0.0759 ± 0.0447 | 30.34 ± 2.89 | 67.54 ± 6.45 |
| PKT | 0.0456 ± 0.0101 | 32.13 ± 2.26 | 83.44 ± 4.84 |

In this study, a radial k-space transformer network was proposed and developed to predict unacquired k-space radial spokes from acquired k-space radial spokes. Preliminary in vivo experiments showed promising results similar to those of the reference images. This proposed network has applications in undersampled radial MRI reconstruction for improved image intensity and reduced streaking artifacts. This study successfully rearranged MRI radial projection to sequential time-series data and predicted unacquired radial spokes using PKT networks. The study demonstrates PKT using golden-angle-ordered 3D radial data. Results showed PKT removed streaking artifacts and noise and had significantly better performance than other state-of-the-art deep learning neural networks. The novel data augmentation strategies in this study generated sufficient training data from a limited number of subjects by acquiring over-sampled multi-coil 3D data at various anatomical regions with the sliding window approach. The study demonstrates that PKT can be applied to various anatomical structures including the abdominal and pelvic regions.

Figure 7:
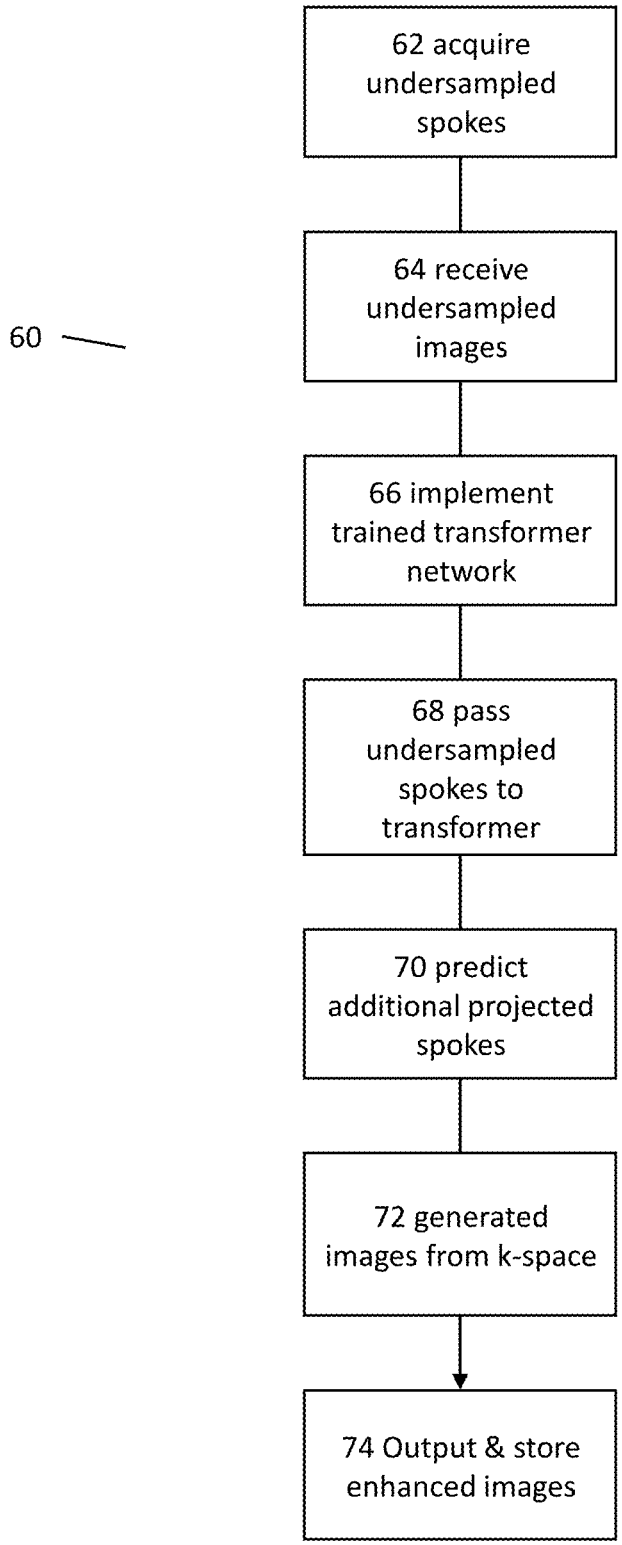
FIG. 7 is a flow chart of an exemplary system for improving imaging using undersampled radial k-space, in accordance with some embodiments.

FIG. 7 illustrates an exemplary method 60 for improving undersampled images and reducing artifacts from undersampled radial imaging. At step 62, a conventional MRI system uses any suitable imaging technique to apply RF and magnetic fields to patient anatomy to acquire undersampled k-space data. This includes acquiring a series of radial spokes in the k-space that are less than the number of spokes needed to completely sample the k-space. In some embodiments, the number of spokes considered to be sufficient to fully sample the k-space is around 400 spokes. In some embodiments, method 60 is used to obtain a 4-fold acceleration by undersampling the k-space with around 25% of the total spokes needed to fully sample the space. In some embodiments, the undersampled radial MRI k-space data include a number substantially around 100, i.e., 95-105 spokes.

At step 64, the data is sent to and received by a processor in the MRI machine. This k-space data can be stored in memory for real-time or later processing. At step 66, the processor (which may include a graphics card suitable for parallel processing of certain network modules) implements the trained transformer network. Training the model will generally take place in advance of the acquisition at step 62. Step 66 can include initiating the model with previously trained values and preparing it for prediction. Step 66 can include initiating multiple instances of the transformer network model, each of which may or may not have unique trained values. For example, as shown in FIG. 4, three separate transformers, each with uniquely trained values based on the angles they will be predicting can be initialized.

At step 68, the processor passes at least a subset of the acquired undersampled spokes from the radial k-space into the encoder portion of each transformer network. At step 70, each transformer network predicts the k-space values for the project spokes that will fill in the k-space. This occurs as explained above. Once all missing spokes are predicted, the undersampled radial MRI k-space data input (e.g., 30) is combined with the projected k-space data (e.g., 40) to create a full k-space at step 72. For example, with three networks, 100 radial samples can become 400 radial samples, with 300 being predicted by the networks. This aggregate k-space data is then transformed using a Fourier transform to generate images from the estimated k-space. At step 74, the image(s) and/or k-space data can be output to a server or terminal and stored in memory.

These steps can be accomplished by the processor and hardware described below.

Medical Imaging System Architecture

Figure 8A:
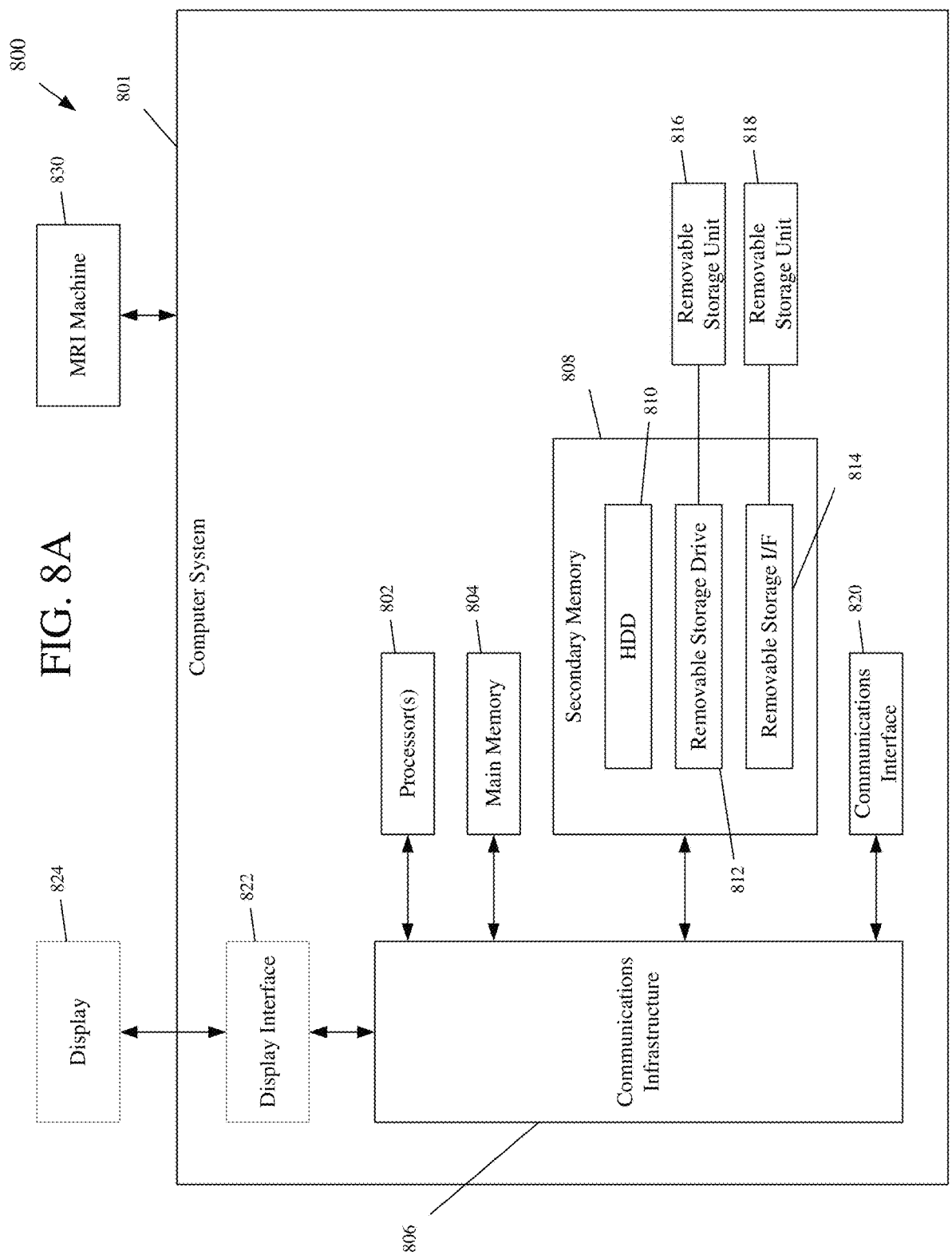
FIGS. 8A and 8B are system diagrams of an exemplary MRI and processor system suitable for implementing some embodiments.
Figure 8B:
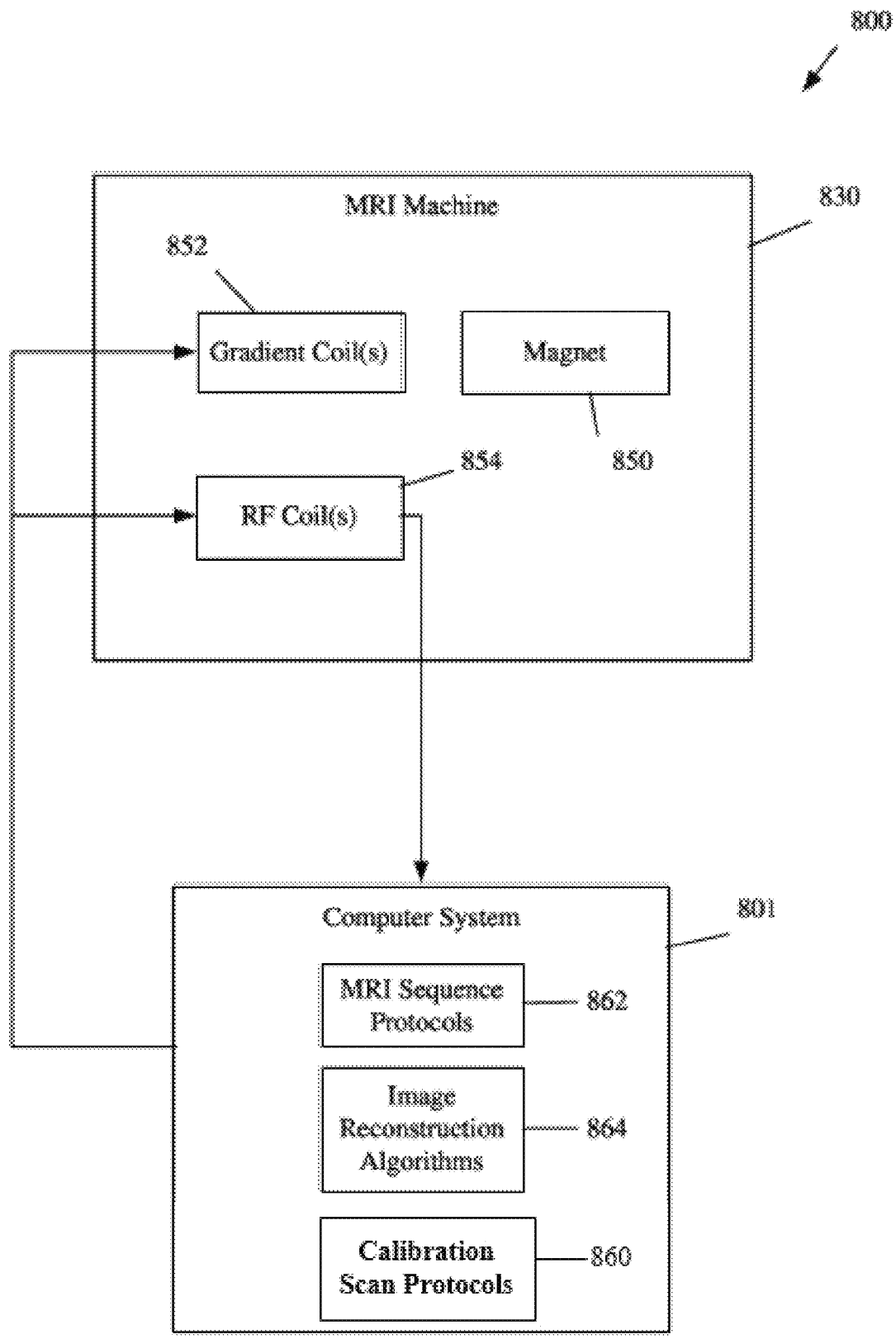

In some embodiments, the systems and techniques described above can be implemented in or by a medical imaging system, such as the medical imaging system 800 illustrated in FIGS. 8A and 8B.

FIG. 8A is an architecture diagram of medical imaging system 800 that may be used in some embodiments. As noted above, the medical imaging system 800 can include a computer system 801 and an imaging machine 830 (e.g., an MRI machine). The computer system 801 may include one or more processors 802. Each processor 802 is connected to a communication infrastructure 806 (e.g., a communications bus, cross-over bar, or network). The processor(s) 802 can include a CPU, a GPU, an AI accelerator, and/or a variety of other processor types. Computer system 801 may include a display interface 822 that forwards graphics, text, and other data from the communication infrastructure 806 (or from a frame buffer, not shown) for display on the display unit 824.

Computer system 801 may also include a main memory 804, such as a random-access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 801. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 801.

Computer system 801 may also include a communications interface 820. Communications interface 820 allows software and data to be transferred between computer system 801 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 801. Computer programs (also referred to as computer control logic) may be stored in main memory 804 and/or secondary memory 808. Computer programs may also be received via communications interface 820. Such computer programs, when executed by a processor, enable the computer system 801 to perform the features of the methods discussed herein. For example, main memory 804, secondary memory 808, or removable storage units 816 or 818 may be encoded with computer program code (instructions) for performing operations corresponding to various processes disclosed herein.

Referring now to FIG. 8B, the MRI machine 830 can include a magnet 850 extending along a bore that is configured to receive a patient therein and that is configured to produce a generally uniform magnetic field, one or more gradient coils 852 that are configured to produce magnetic field gradients (e.g., linear gradients), and one or more RF coils 854 that are configured to transmit to RF signals to the patient's body and/or receive RF signals therefrom. The computer system 801 (embodiments of which are described in greater detail above) can store and implement calibration scan protocols 860, MRI sequences protocols 862, and/or image reconstruction algorithms 864, as well as a variety of other software modules known in the technical field. The MRI sequence protocols 862 can be embodied as instructions that, when executed by the computer system 801, cause the computer system 801 to control the gradient coils 852 and/or RF coils 854 to apply a particular sequence of magnetic field gradients and/or RF pulses to the patient. The image reconstruction algorithms 864 can be embodied as instructions that, when executed by the computer system 801, cause the computer system 801 to reconstruct an image of the patient based on the RF signal received from the patient (e.g., by the RF coils 854) as caused by the MRI sequence applied thereto. In one embodiment, the image reconstruction algorithms 864 could include a transformer network implemented and trained using the techniques described above to remove or reduce image artifacts from an undersampled MR image.

Additional Embodiments

While the proposed methods have been primarily described with respect to a radial k-space sampling trajectory radial, embodiments can be applied to other k-space sampling trajectories. Exemplary embodiments can apply these same techniques taught throughout to spiral-based or other non-Cartesian k-space trajectories and echo-planar-imaging (EPI) or other Cartesian k-space trajectories.

As an example, the spiral-based trajectories can be pre-processed similarly as the radial trajectory shown in FIG. 3. Similar to the radial trajectory, a multi-shot spiral trajectory consists of multiple spokes in the k-space, where the spokes are curved lines in spiral trajectories and straight lines in radial trajectories. FIG. 9A shows an illustration of the pre-processing steps of the spiral trajectory. Each spiral spoke can be straightened and rearranged based on the moment of acquisition. The rest of processing steps can be the same as the radial trajectory. The proposed method can be used to predict the spiral spokes in an interleaved fashion.

Figure 9B:
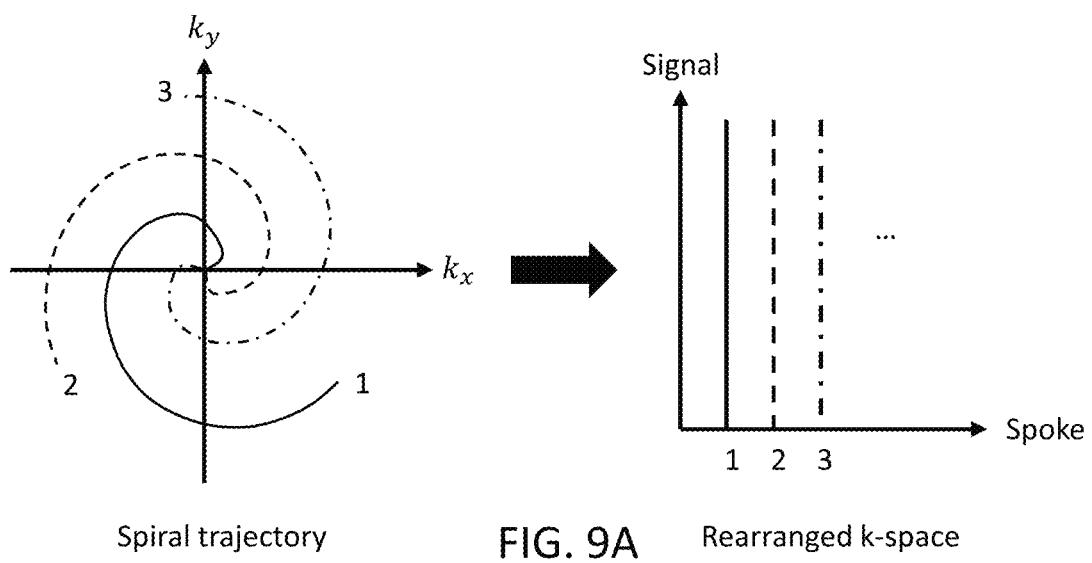
Figure 9B:
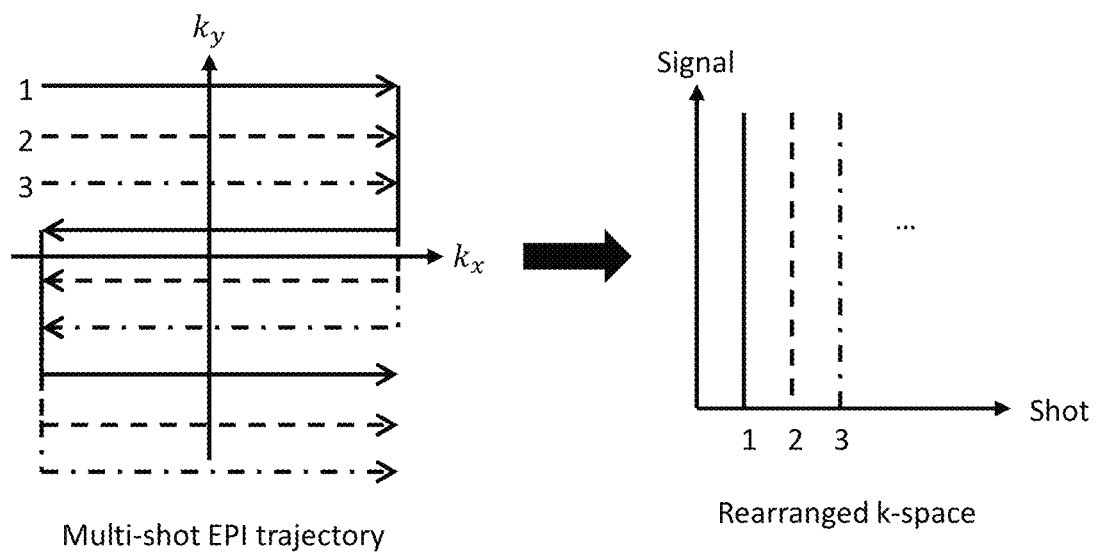

Exemplary embodiments can also be used on cartesian EPI trajectories where unacquired lines can be predicted by the network. FIG. 9B illustrates an example of multi-shot EPI trajectory. In each excitation (or shot), the data is acquired through a rasterized traversal of k-space, where the directions of phase encoding lines alternate between left-to-right and right-to-left. K-space data from each shot can be aligned to a vector and different shots can be rearranged according to their acquisition moment. Finally, the rearranged k-space data can be processed similarly as the rearranged radial k-space data and the network can predict the unacquired phase encoding lines.

While FFTs are presented as the exemplary tool for image reconstruction, multiple variants of the transform or other transforms can be used. In various embodiments, k-space radial spokes can be used to reconstruct images using transform functions, such as 1D FFT (e.g., to get the projections), log-based functions, or sigmoid-based functions (to apply different weightings on the k-space data).

Various training methods for the learning algorithms used herein can be applied. Data augmentation techniques can be used, such as the sliding window approach illustrated in FIG. 5.

While illustrative embodiments typically pass the radial spokes to the transformer network in the order acquired, it should be understood that any selected or arbitrary order can be used (provided the network is properly trained for the order). This is because the network is suitable to learn any order or inputs and the relationship with the outputs. The manner in which the spokes are acquired can use suitable method, such as gating acquisition based on heart rate or breathing. Alternatively, algorithmic gating after acquisition can be used to select captured spokes based on the absence of motion artifacts. While golden angle acquisition is well established, any selected angular order can be used.

It is understood by those familiar with the art that the system described herein may be implemented in hardware, firmware, or software encoded (e.g., as instructions executable by a processor) on a non-transitory computer-readable storage medium.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A system for recreating images from undersampled MRI image data comprising:
   an MRI imaging system comprising a plurality of magnets and RF coils configured to acquire undersampled radial MRI k-space data comprising acquired radial lines; and
   a processor and memory configured to execute software instructions that implement one or more transformer networks that is trained to predict additional projected radial MRI k-space data from the undersampled radial MRI k-space data and to generate MRI images from the additional projected radial MRI k-space data and undersampled radial MRI k-space data,
   wherein the one or more transformer networks includes three independent transformer networks, each transformer network of the three independent transformer networks configured to predict a number of radial lines of k-space data equal to a number of the acquired radial lines.

2. The system of claim 1, wherein the processor and memory are further configured to pass the undersampled radial MRI k-space data to the one or more transformer networks in an order corresponding to a chronological order in which radial lines were captured.

3. The system of claim 1, wherein each of the three independent transformer networks is trained to predict a number of radial lines of k-space data at predetermined angles.

4. The system of claim 1, wherein the number of acquired radial lines is substantially around 100.

5. The system of claim 1, wherein the processor and memory are further configured to convert the additional projected radial MRI k-space data and undersampled radial MRI k-space data to an image using a transform function.

6. The system of claim 1, wherein the processor and memory are further configured to pass the undersampled radial MRI k-space data to the one or more transformer networks including both real and imaginary values.

7. The system of claim 1, wherein the one or more transformer networks comprise a predetermined number of encoder blocks and a predetermined number of decoder blocks, wherein
   each encoder block comprises a self-attention layer and a feed-forward neural network, and
   each decoder block comprises a feed-forward neural network and a two self-attention layers, one determining attention values between past outputs of decoder blocks and one determining attention values between outputs of encoder blocks.

8. The system of claim 1, wherein a sum of the number of radial lines of k-space data predicted by each of the three independent transformer networks and the number of the acquired radial lines is a number of radial lines required to form a fully-sampled radial k-space.

9. The system of claim 8, wherein the number of radial lines required to form a fully-sampled radial k-space is substantially around 400.

10. A method for recreating images from undersampled MRI image data comprising:
    acquiring undersampled radial MRI k-space data using an MRI imaging system comprising a plurality of magnets and RF coils;
    implementing one or more transformer networks that is trained to predict additional projected radial MRI k-space data from the undersampled radial MRI k-space data;
    predicting, using one or more transformer networks that are implemented by a processor and memory, additional projected radial MRI k-space data from the undersampled radial MRI k-space data; and
    generating MRI images from the additional projected radial MRI k-space data and undersampled radial MRI k-space data,
    wherein the one or more transformer networks includes three independent transformer networks, each transformer network of the three independent transformer networks configured to predict a number of radial lines of k-space data equal to a number of acquired radial lines of the undersampled radial MRI k-space data.

11. The method of claim 10, wherein the step of predicting additional projected radial MRI k-space data comprises passing the undersampled radial MRI k-space data to the one or more transformer networks in an order corresponding to a chronological order in which radial lines were captured.

12. The method of claim 10, wherein the one or more transformer networks comprise three independent transformer networks, each trained to predict a number of radial lines of k-space data at predetermined angles, the number being equal to a number of radial lines in the undersampled radial MRI k-space data.

13. The method of claim 12, wherein the number of radial lines is substantially around 100.

14. The method of claim 10, wherein the predicting additional projected radial MRI k-space data comprises passing the undersampled radial MRI k-space data to the one or more transformer networks as both real and imaginary values.

15. The method of claim 10, wherein the one or more transformer networks comprise a predetermined number of encoder blocks and a predetermined number of decoder blocks, wherein
    each encoder block comprises a self-attention layer and a feed-forward neural network, and
    each decoder block comprises a feed-forward neural network and a two self-attention layers, one determining attention values between past outputs of decoder blocks and one determining attention values between outputs of encoder blocks.

* * * * *